United States Patent [19]
Ducasse et al.

[11] Patent Number: 5,376,565
[45] Date of Patent: Dec. 27, 1994

[54] FABRICATION OF LATERAL BIPOLAR TRANSISTOR

[75] Inventors: Jean-Paul Ducasse, Plaisance; Patrick Gueulle, Grazac-Auterive, both of France

[73] Assignee: Motorola Semiconducteurs S.A., Toulouse Cedex, France

[21] Appl. No.: 21,401

[22] Filed: Feb. 23, 1993

[30] Foreign Application Priority Data

Feb. 24, 1992 [FR] France ............... 92 02111

[51] Int. Cl.$^5$ .................................. H01L 21/265
[52] U.S. Cl. .................... 437/32; 437/917; 437/55
[58] Field of Search ............. 437/31, 32, 55, 917

[56] References Cited

U.S. PATENT DOCUMENTS

| | | | |
|---|---|---|---|
| 3,891,480 | 6/1975 | Fulkerson | 437/917 |
| 4,021,270 | 5/1977 | Hunt et al. | 437/55 |
| 4,110,126 | 8/1978 | Bergeron et al. | 437/55 |
| 4,403,395 | 9/1983 | Curran | 437/55 |
| 4,440,580 | 4/1984 | Gable | 437/32 |
| 4,446,611 | 5/1984 | Bergeron et al. | 437/32 |
| 4,544,940 | 10/1985 | Weaver, II et al. | 357/35 |
| 4,616,405 | 10/1986 | Yasuoka | 29/578 |
| 4,978,630 | 12/1990 | Kim | 437/917 |
| 5,254,486 | 10/1993 | Alter | 437/32 |

FOREIGN PATENT DOCUMENTS 0437834 12/1990 European Pat. Off. .
3259533 11/1991 Japan .................. 437/917

OTHER PUBLICATIONS

Journal of the Electrochemical Society, vol. 126, No. 4, Apr. 1979, Manchester New Hampshire, pp. 642–644, R. Kesavan et al., "Enhancement of Lateral P-N-P Current Gain by Gettering".

*Primary Examiner*—Tom Thomas
*Assistant Examiner*—Tuan Nguyen
*Attorney, Agent, or Firm*—Miriam Jackson

[57] ABSTRACT

A process for forming a lateral bipolar transistor wherein apertures for forming a current electrode (collector or emitter) region, a base region and an isolation region are all formed simultaneously so that they are automatically aligned. Also, a mask area covering the base region when the current electrode region is being doped only covers the base (oversize) region. The mask is easier to remove after it has itself been doped/cured during the implantation process because it is smaller.

14 Claims, 11 Drawing Sheets

FABRICATION OF LATERAL BIPOLAR TRANSISTOR

FIELD OF THE INVENTION

The present invention relates to a lateral transistor formed on a substrate, and a method of fabricating the same.

BACKGROUND ART

Lateral bipolar transistors, normally PNP transistors, formed in integrated circuits have a variety of applications. Their method of fabrication depends on the voltages to which they will be subjected to in use and there are characteristically different processes for the three voltage ranges (1) less than 5 volts, (2) between 5 and 12 to 14 volts and (3) between 14 and 25 volts. One of the critical parameters is that of width of isolation between active regions to prevent electrical breakdown between active regions in the condition of maximum operating voltage. In particular, for case (2) where the lateral transistor is designed as a power transistor to operate with voltages up to 12 or 14 volts, it is important to minimize dimensions of the transistor in order to reduce parasitic resistances, while maintaining adequate spacing between active regions to ensure that breakdown does not occur on maximum operating voltage.

In the prior art, such lateral pnp transistors are formed in large numbers on a common substrate together with vertical npn transistors. In the prior art, a p-type substrate has an n-type epitaxial layer formed thereon. Above this a silicon oxide layer is formed and then subsequently a silicon nitride layer which is employed to form a master mask. The master mask defines the isolation and base regions of the vertical npn transistors, and a further oversize isolation mask is employed to cover the base region while the isolation regions are formed by boron diffusion. The isolation mask is then removed to permit doping of an npn base region. Emitter and collector regions are formed and processed using extra masks, with consequent alignment problems.

A problem in the past has been that because of alignment tolerances in the process arising from the various processing masks superimposed on the substrate, it has been necessary to make the dimensions of the transistor relatively large in order to accommodate these tolerances. This has the disadvantage of extra size and consequent increased parasitic resistances.

U.S. Pat. No. 4,837,176 discloses the formation of a lateral transistor using a master mask. However the patent is concerned with planarisation of polysilicon layers and is not concerned with the present problems.

SUMMARY OF THE INVENTION

It is an object of the invention to overcome the above mentioned problem and to provide a process for a lateral transistor wherein the dimensions of the transistor may be reduced.

The present invention provides a process for forming a lateral bipolar transistor, the process comprising:

1) forming on a silicon substrate, in sequence, an epitaxial layer, a silicon oxide layer, a silicon nitride layer and a masking layer;

2) forming in a single masking operation in said masking layer, an aperture for an emitter or collector region, the aperture being surrounded by channels defining an isolation region;

3) processing said layers by selective etching, and doping, to provide isolation means emitter said isolation region and to provide within said emitter or collector region a highly conductive doped area.

Thus in accordance with the invention by providing a mask in a single masking operation which defines the geometry of the lateral pnp emitter/collector region in relation to surrounding isolation, the alignment tolerances of the transistor may be reduced as compared to prior art processes.

Further the formation of a highly conductive area in the emitter/collector region preferably by an implantation step of boron, reduces the parasitic series resistance in these regions and thus contributes to a more efficient power transistor.

In the preferred embodiment of the present invention, the master mask in addition provides apertures for the definition of the base regions of vertical npn transistors, which are doped to a level less than that of the emitter/collector regions. Thus, the master mask is employed defining the isolation, base and emitter/collector regions; these 3 regions will in this manner automatically be self aligned to reduce alignment tolerances.

Subsequent to definition of the single mask, a further oversize isolation is employed to enable the isolation regions to be formed by diffusion of boron through the isolation mask and the master mask to form isolation junctions.

Subsequent to formation of the isolation regions, the oxide layer beneath the mask is etched and a further oversize mask layer is employed to mask the base region while the emitter/collector regions are subjected to a p+ implantation of boron to provide a highly conductive region. Subsequently the material masking the base is removed and all regions defined by the master mask are subject to a p− implantation.

In this way the size of the elementary transistor may be reduced and the parasitic resistances associated therewith reduced.

In the formation of a practical transistor a large number of elementary transistors will be formed geometrically side by side and interconnected by metal layers and vias through isolation regions. As will appear below, the elementary transistors are designed in an octagonal shape in order to permit close packing of the transistors on the substrate, to reduce high voltage stress regions which may occur with more simple rectangular shape transistors, and to reduce parasitic resistance in the emitter/collector regions.

BRIEF DESCRIPTION OF THE DRAWINGS

A preferred embodiment of the invention will now be described with reference to the accompanying drawings, wherein.

DESCRIPTION OF THE PREFERRED EMBODIMENT

Figure 1:
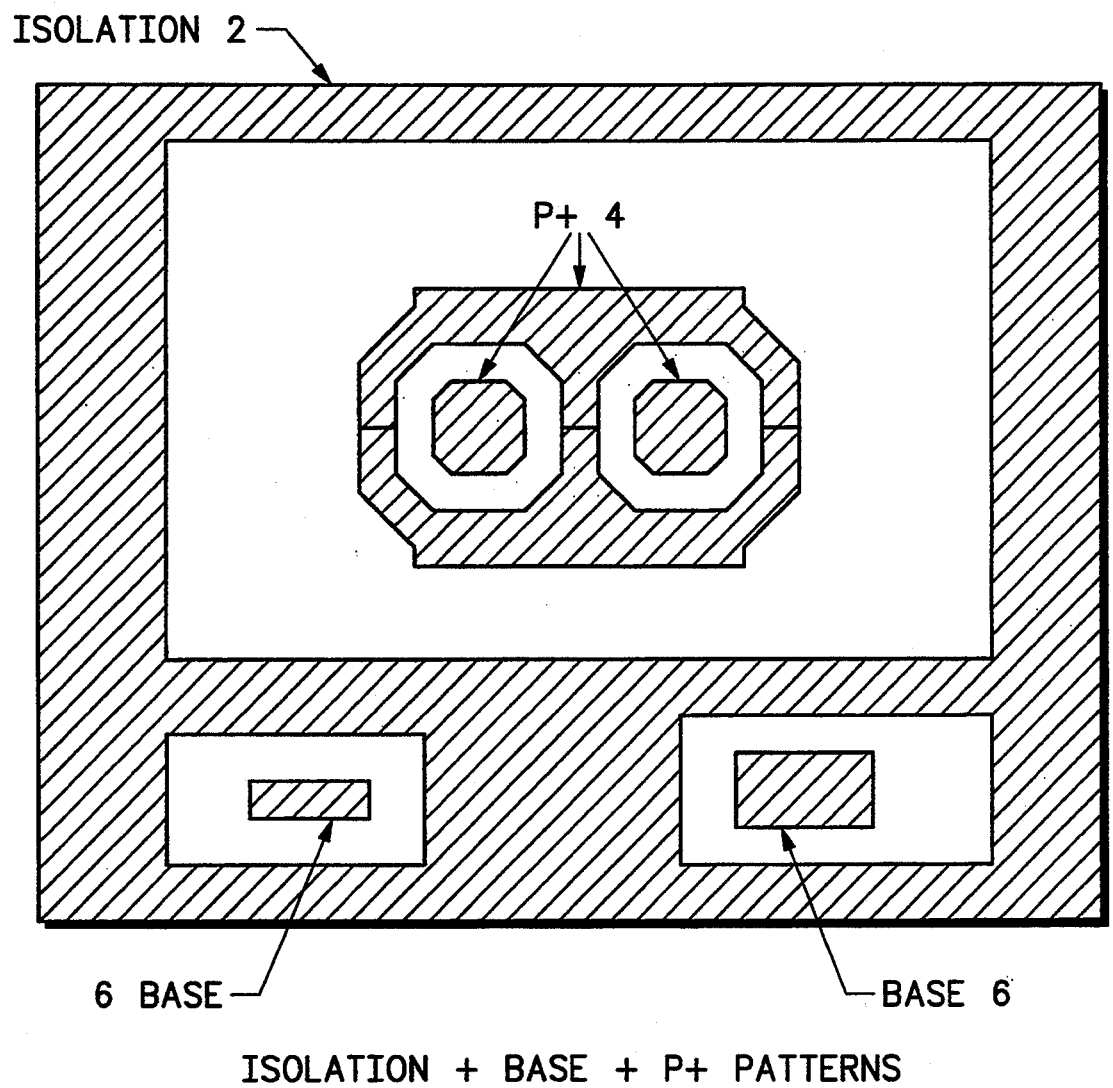
FIG. 1 is a schematic view of a mask employed in a process in accordance with the invention.

Referring now to the drawings, in FIG. 1 a three-level master mask is generated by merging on the same mask layer isolation 2, emitter/collector (P+) patterns 4 for pnp lateral transistors and base patterns 6 for vertical npn transistors; these three patterns will be in this manner automatically self-aligned. It will be understood that in practice a very large number of regions will be defined by the mask extending over a silicon substrate. This allows the elimination of the alignment tolerances between these three layers and therefore saves space and minimizes device parasitics. The circuits can also be designed smaller and consequently at a lower price.

The purpose of using a heavily doped P+ implantation in the emitter region is to increase the emitter efficiency of the PNP transistor, that is to say to get a higher current gain capability at a higher collector current. The second advantage of using a P+ implantation is to reduce the parasitic emitter and collector series resistances, because the P+ sheet rho is much lower than using a standard base implantation in the emitter and collector regions. The base layer is essentially used for making NPN transistors, standard lateral and vertical PNP transistors and base resistors.

Referring now to FIGS. 2 to 16, similar parts are denoted by the same reference numeral.

Figure 2:
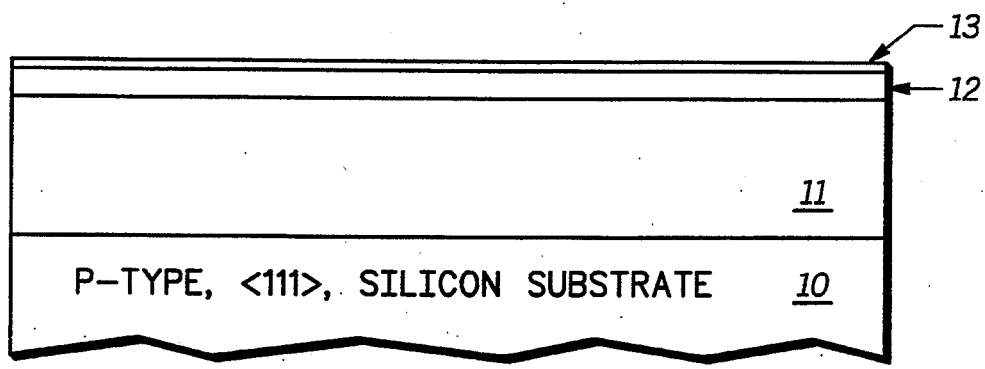
FIGS. 2 to 17 are sectional views through a silicon substrate illustrating various steps in the formation of a transistor according to the invention.

Referring to FIG. 2, a P-type <III> silicon substrate 10 has an N type epitaxial layer 11 thereon. After growth of a SiO2 layer 12 formed by thermal oxidation of the N type epitaxial layer 11, a 1250 Å silicon nitride film 13 is deposited for patterning by plasma using the three-level master mask.

Figure 3:
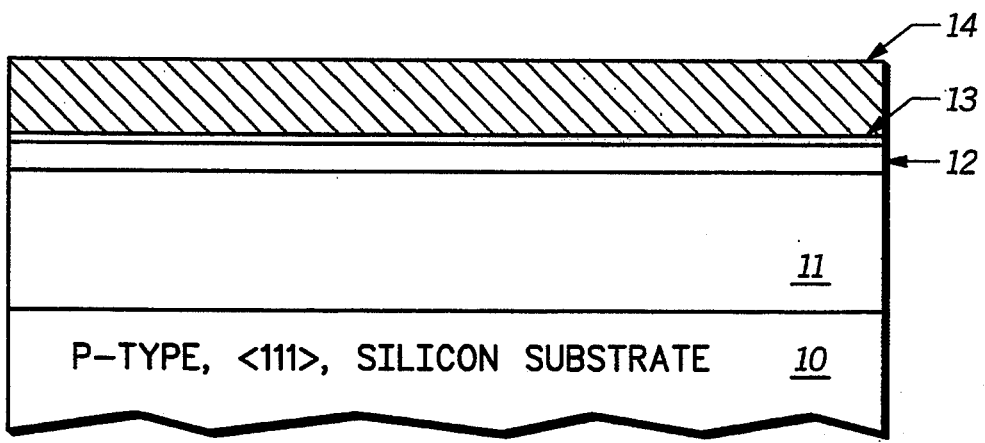

In FIG. 3, a negative photoresist 14 is deposited on layer 13.

Figure 4:
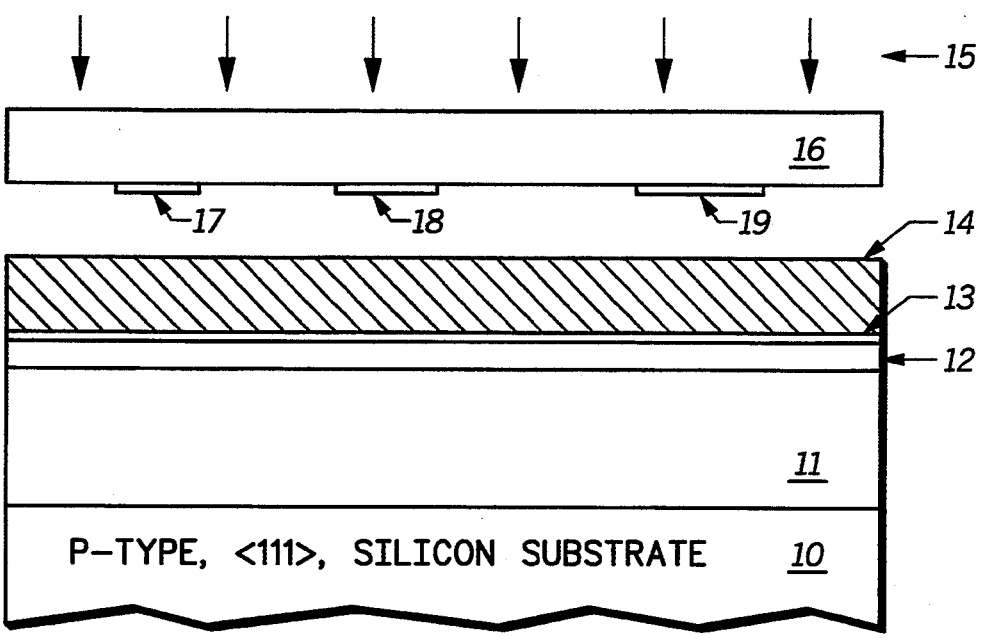

In FIG. 4, the negative photoresist layer 14 is exposed to U.V light 15 of an alignment machine through an optical master mask 16: the patterns 17, 18 and 19 of the master mask 16 correspond to the isolation, base and P+ patterns respectively. As the three patterns 17, 18 and 19, corresponding to three different types of diffused patterns, are defined at the same time, they are self-aligned.

Figure 5:
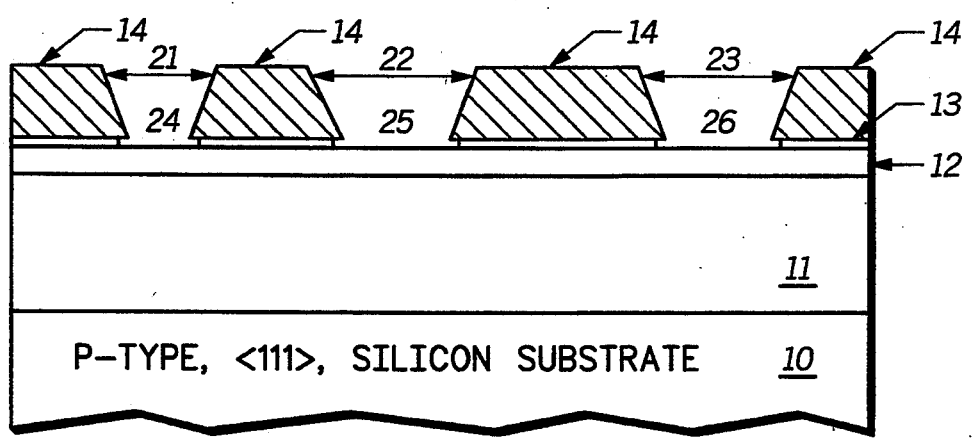

In FIG. 5, the photoresist 14 protected by the patterns 17, 18 and 19 from the master mask 16 is chemically removed to form three apertures 21, 22 and 23 which permit plasma patterning in the regions 24, 25 and 26 of the silicon nitride film 13; then, the remaining photoresist 14 is removed.

Figure 6:
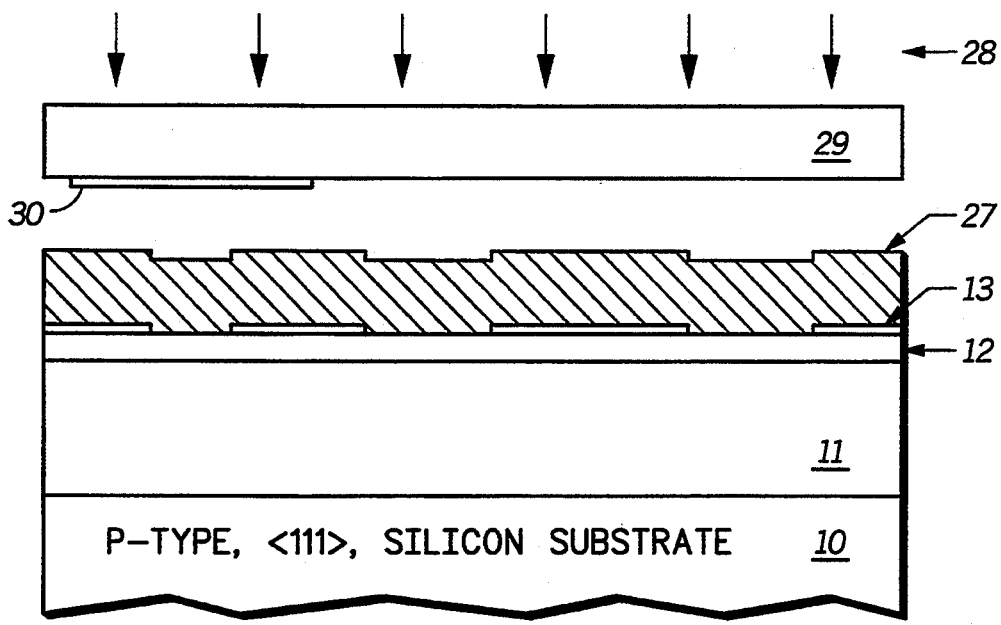

As shown in FIG. 6, another negative photoresist layer 27 is deposited and exposed to U.V. light 28 of an alignment machine through an optical oversize isolation mask 29 having a pattern 30 for an oversize isolation mask.

Figure 7:
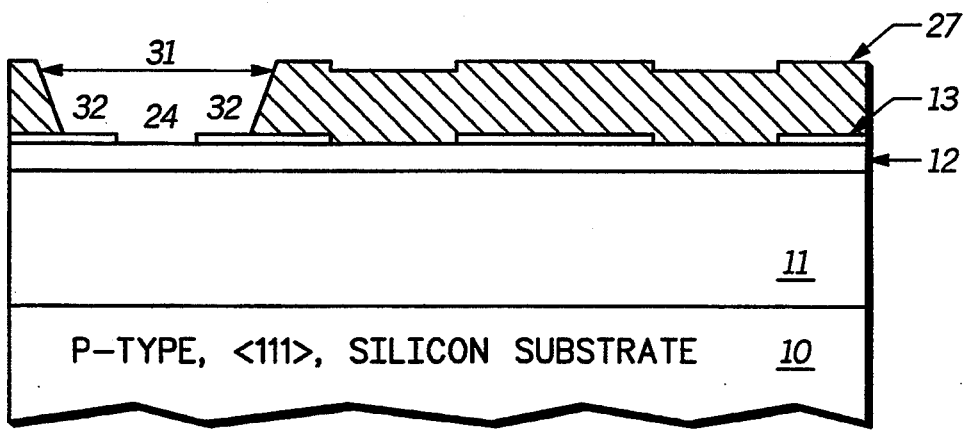

As shown in FIG. 7, the alignment tolerance between the aperture 31 formed by the oversize isolation mask pattern 30 and the pattern 24 on the silicon nitride film 13 is such that an aperture 31 in the patterned photoresist 27 always overlaps the unpatterned portions 32 of the nitride film 13.

Figure 8:
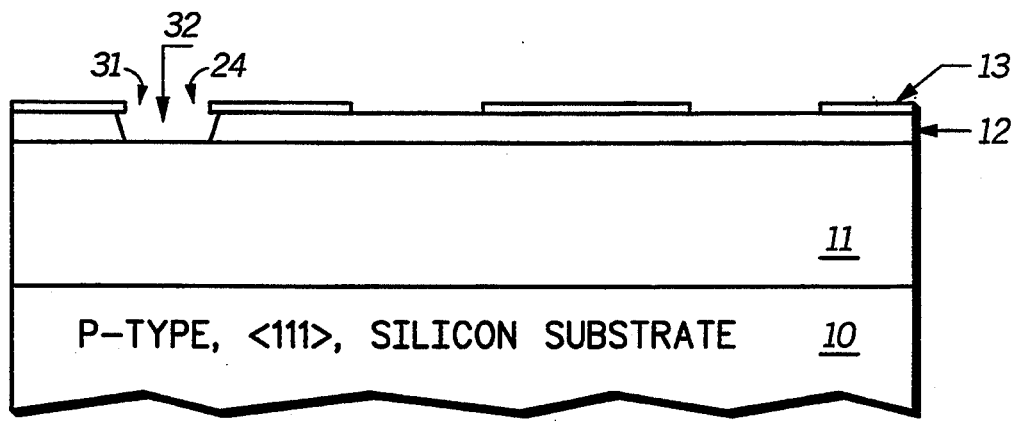

As shown in FIG. 8, an etching operation then takes place to remove photoresist 27 and to etch silicon dioxide 12 as at 32, inside the photoresist aperture 31. The aperture 32 in the silicon dioxide 12 is solely defined by the aperture 24 in the silicon nitride film 13.

Figure 9:
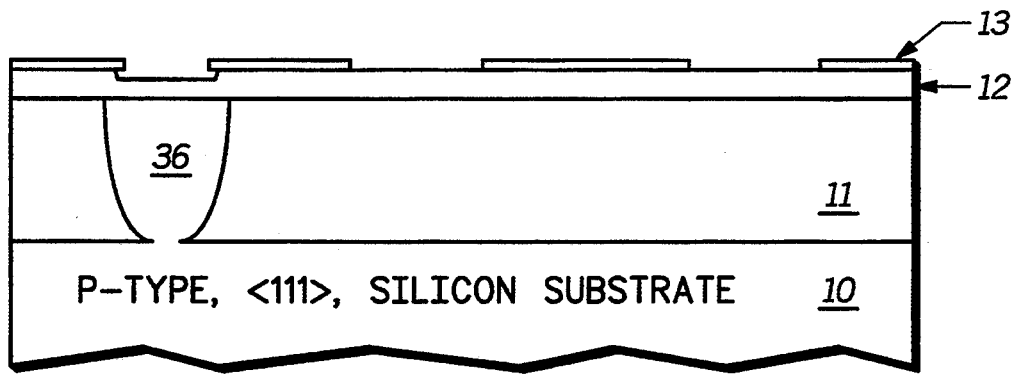

Referring now to FIG. 9, a B2O3 solution is coated by spin-on on the entire wafer. The wafer is then placed in a high temperature furnace so that the boron diffuses into the silicon to form a P-type isolation path 36 in the epitaxial layer 11. Only one isolation path 36 is represented, for simplicity.

Figure 10:
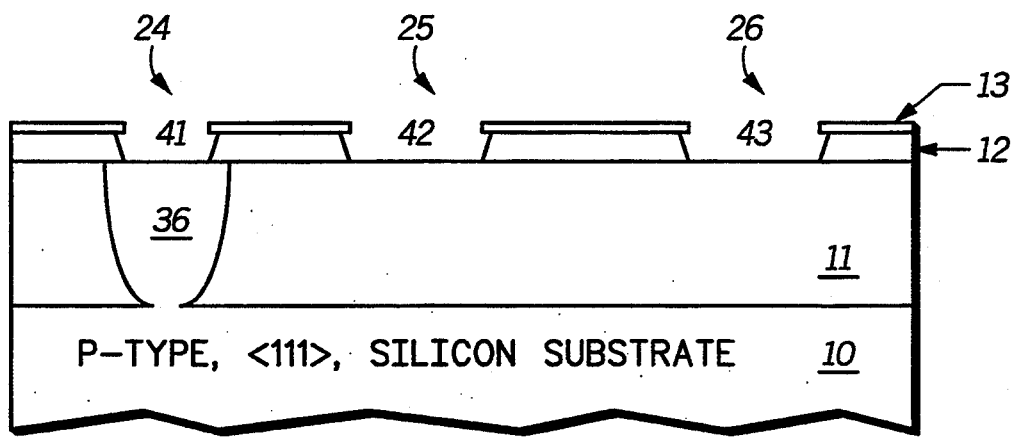

In FIG. 10, after isolation diffusion, the portion of silicon dioxide beneath the apertures 24, 25 and 26 in the silicon nitride film 13 is wet etched as at 41, 42 and 43.

Figure 11:
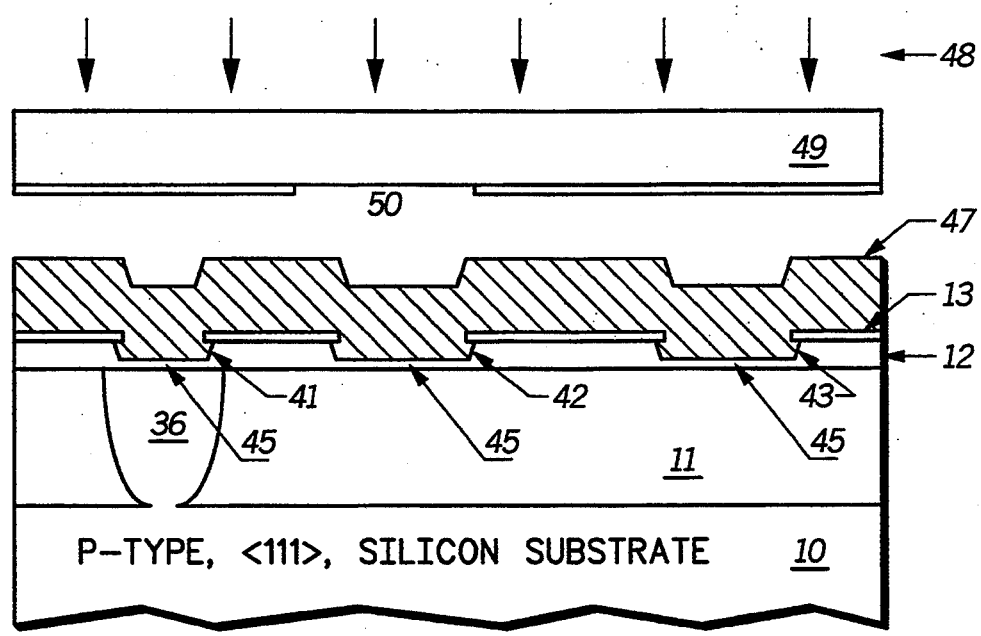

Referring to FIG. 11, after growth of a 1500 Å thermal silicon dioxide 45 in the apertures 41, 42 and 43, a negative photoresist layer 47 is deposited on the entire wafer and then patterned by U.V light 48 from the alignment machine through an optical negative oversize base mask 49. The oversize base pattern 50 is obtained by oversizing the base pattern 50 such that the aperture 42 used for the future P-type base be always protected by photoresist during the P+ implantation. The oxide layer 12 is sufficiently thick in the other regions to protect these regions against the P+ implantation.

Figure 12:
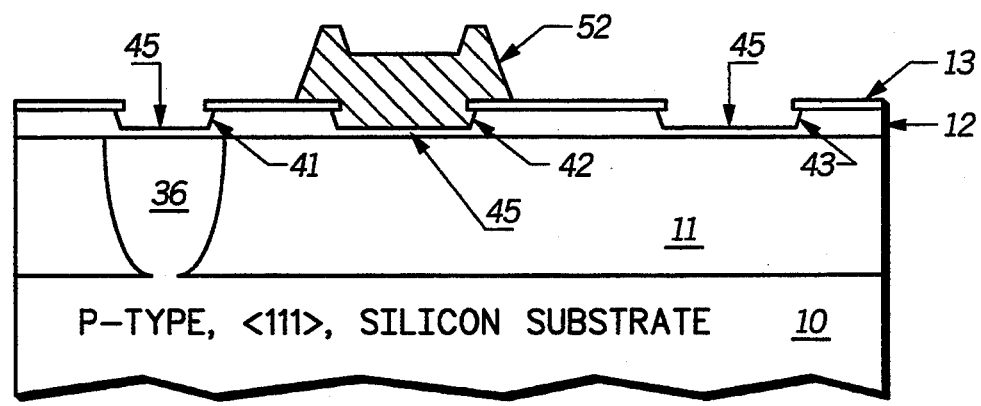

As shown in FIG. 12, the patterned negative photoresist 52 defined by pattern 50 is disposed over the base aperture 42.

Figure 13:
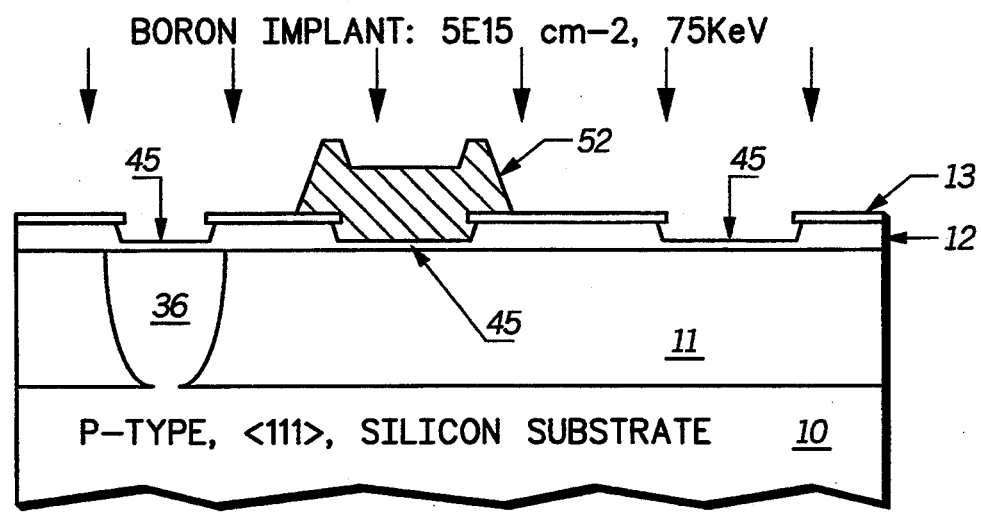

FIG. 13 shows P+ regions being implanted (dose=-5E15 cm−2, energy=75 KeV) in the epitaxial area 11 and the isolation path 36 through the screen oxide 45 to eliminate the channelling effect of dopant impurities in the silicon.

Figure 14:
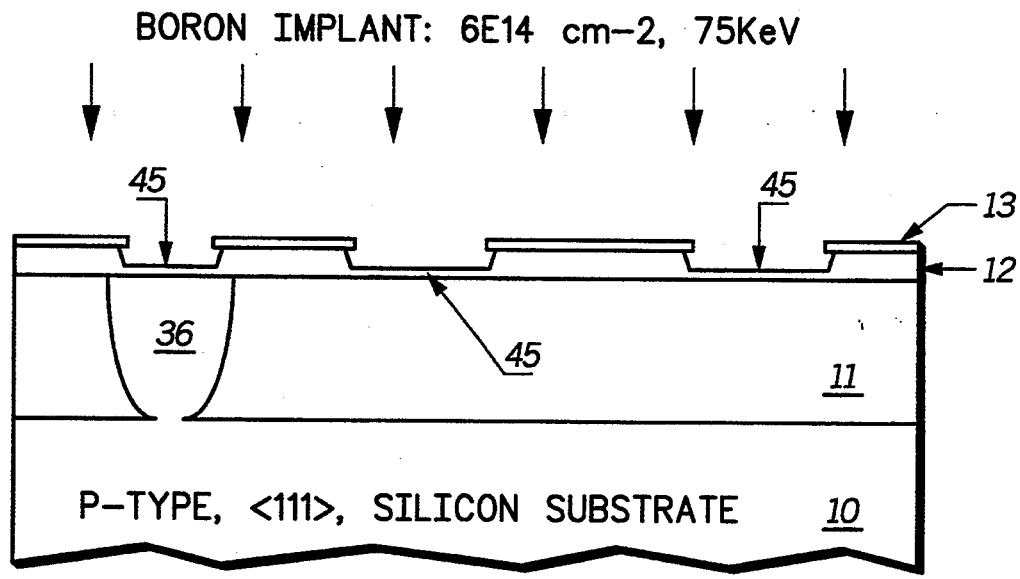

The photoresist 52 is then removed, as shown in FIG. 14, from the wafer. The base is implanted (dose=6E14 cm−2, energy=75 KeV) in the silicon through the the screen oxide 45 to eliminate the channelling effect of dopant impurities in the silicon.

Figure 15:
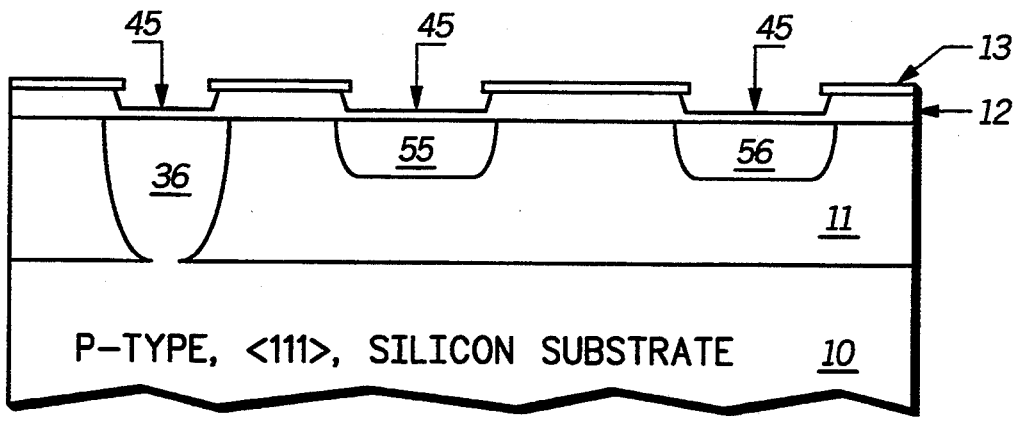

The result as shown in FIG. 15 is that finally, base and P+ regions are located in the epitaxial area 1 as at 55 and 56 respectively.

Figure 16:
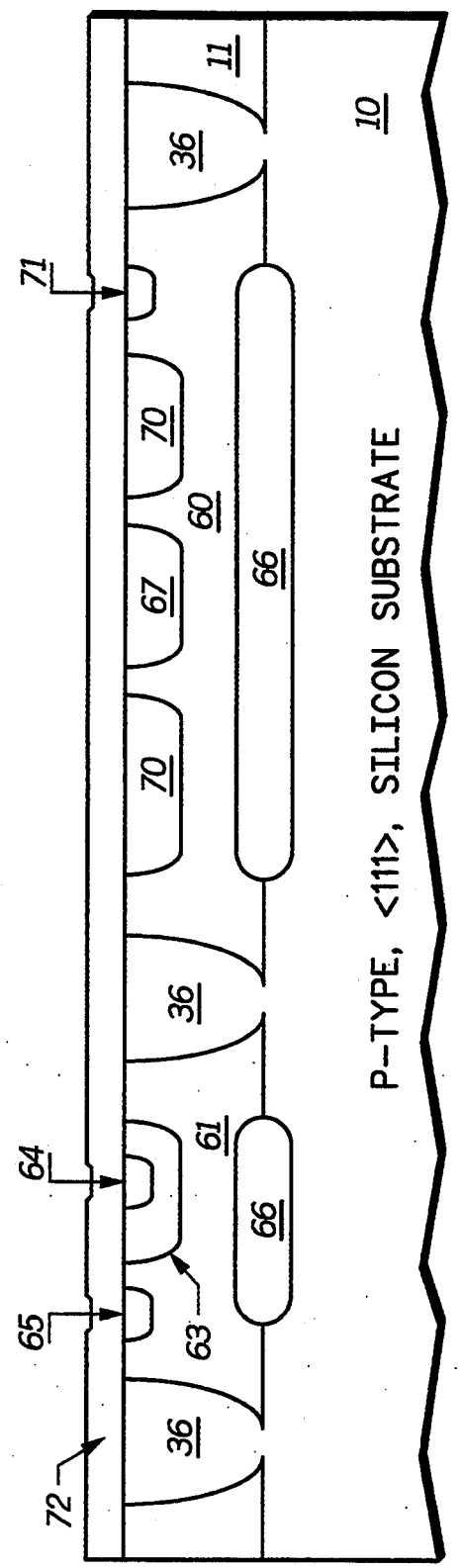

The arrangement of FIG. 15 is purely schematic in regard to the arrangement of base and P+ regions, and FIG. 16 shows a more practical arrangement with a lateral pnp transistor 60 and a vertical npn transistor 61 isolated by isolation regions 36. Transistor 61 comprises a P− base 63, a N+ emitter 64, and an N+ collector region 65; an heavily doped N region 66 is also shown. Lateral transistor 60 comprises a P+ emitter region 67, two P+ collector regions 70 and an N+ base contact 71.

In FIG. 16, the oxide 12 and nitride 13 layers are removed and a further layer of SiO2 72 is grown. Apertures (not shown) are formed in layer 72 by masking and wet etching to permit diffusion of N+ regions 64,65,71.

Figure 17:
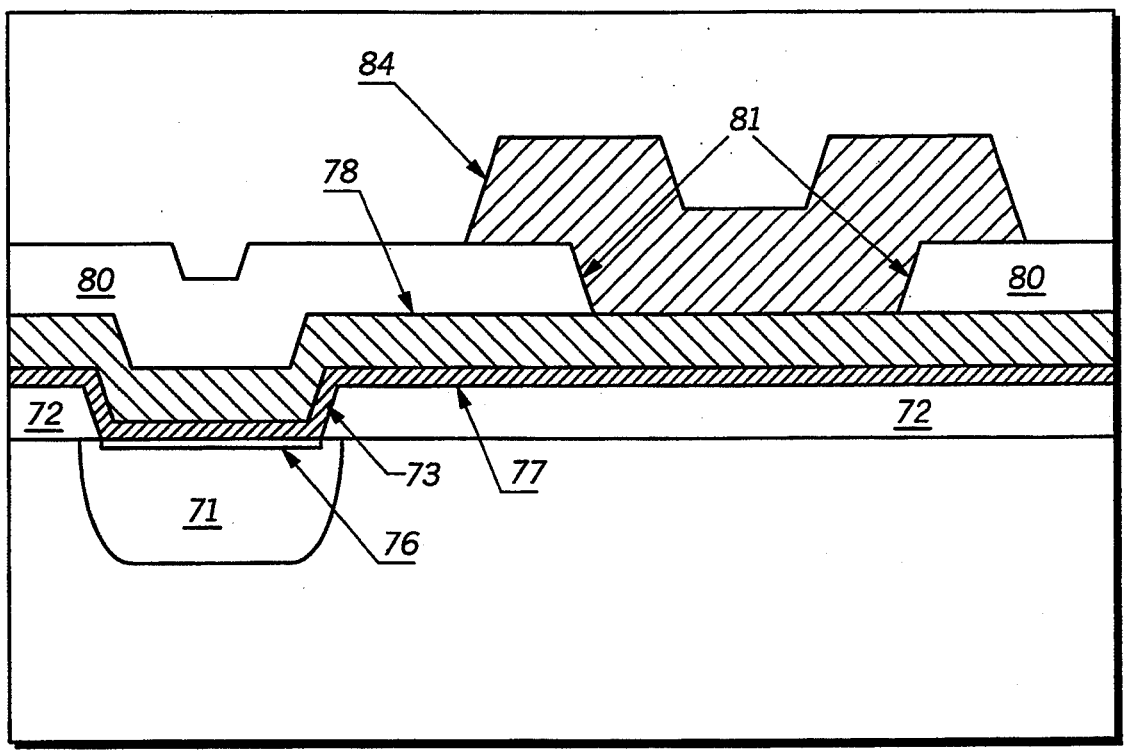

Referring now to FIG. 17, the "3 metal" metallisation process is shown for forming metal contacts to the active regions.

To get a better contact between any diffusion pattern (P or N-type), say base contact 71 and a metal strip 78, the following procedure is used.

An aperture 73 is formed in the silicon dioxide 72, using standard procedures for masking and etching, and a platinum layer (not shown) is deposited on the entire wafer. Platinum in contact to the silicon, in all apertures 73 formed in the silicon dioxide 72, is thermally alloyed to the silicon to form a platinum silicide (PtSi) layer 76; the platinum (Pt) over the silicon dioxide 72, which is not alloyed to the silicon, is then chemically removed.

Titanum tungsten (TiW) 77 and aluminium copper (AlCu) 78 are deposited on the entire wafer and etched using standard procedures of masking and metal etching to get metal strips; the purpose of titanium tungsten is to form a barrier to the aluminium copper 78. This is called the trimetal process and the mount of PtSi 76, TiW 77 and AlCu 78 defines the first metal layer, often called Metal 1.

An interlayer silicon dioxide 80 is then deposited on the entire wafer and etched using standard procedures of masking and etching to get the via 81; the via 81 is an aperture in the interlayer silicon dioxide 80 to allow a connection, in the area defined by the via 81, between the first 78 and the second deposited aluminium copper layers; this second aluminium copper layer 84 is often called Metal 2. Metal 2 (84) is usually three times thicker than the aluminium copper layer 78 from Metal 1. The methodology of etching Metal 2 (84) is the same as for the aluminium copper layer 78 from Metal 1.

Figure 24:
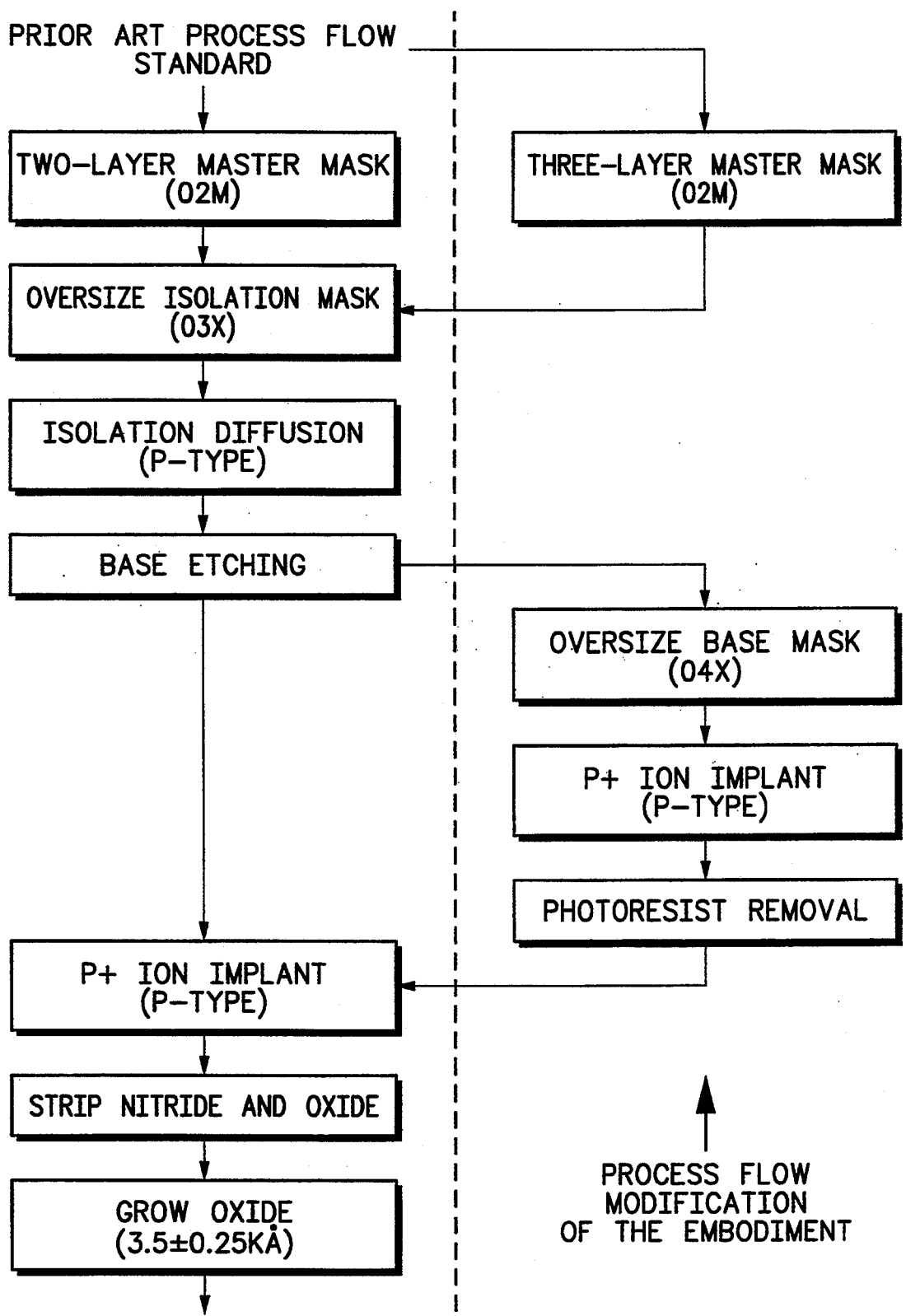
FIG. 24 is a flow chart comparing the process in accordance with the invention with an existing process.

Referring to the flow chart of FIG. 24, the process steps described above are indicated in relation to the prior art process. Following implantation of the base, the nitride and oxide layers are stripped, and further oxide is grown. It will be noted there are no extra high-temperature steps which would change the impurity concentration profiles of the diffused layers with the present embodiment.

Figure 25:
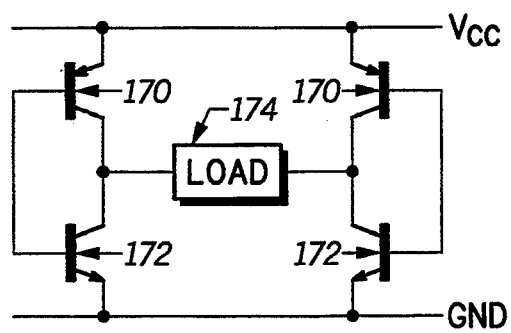
FIG. 25 is a circuit diagram of transistors arranged in bridge configuration to drive a load.

Referring now to FIG. 25, this shows a known circuit comprising a bridge of PNP power transistors 170 and NPN power transistors 172 driving a load 174, where low saturation voltages are absolutely necessary for efficient operation. The voltage drops in the transistors 170 and 172 when saturated, must be as low as possible to minimize the voltage losses for driving the load 174. The peak voltage value necessary for driving the load 174 of the full-bridge amplifier of FIG. 25 can be expressed as:

$$VLOAD = VCC - (VCESAT_{NPN} + VCESAT_{PNP})$$

The PNP transistors 170 may be formed as an array of interconnected elementary PNP transistors on a single substrate, the elementary transistors being formed by the process of the present invention. As transistor size is one of the most important criteria to get improved cost-effectiveness, the starting point of the layout of the present embodiment is to use a double layer metallization. The second point is to minimize the spacings between preohmics (contact areas on silicon) and diffusion edges based upon the use of a trimetal process (Pt, TiW, AlCu); the PtSi alloy in the contact areas is only a few hundreds of Angstoms deep. The third point is to lower the parasitic series resistances connected to the active transistor, in optimizing the layout and decreasing the current densities in distributing the contact areas; these series resistances have a very strong effect at high injection.

Figure 18:
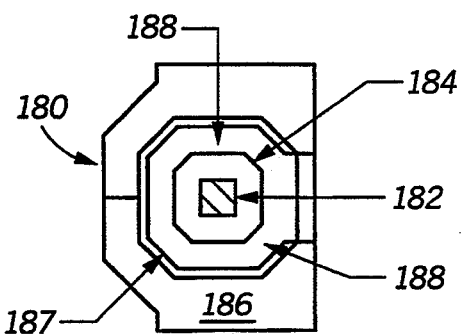
FIGS. 18 to 23 illustrate steps in the formation of an array of elementary transistors according to the invention to form a single large power transistors.

Referring to FIG. 18, the starting point for laying out an elementary power lateral PNP transistor 180 is the smallest pattern allowed with optical masks, a $5 \times 5$ $\mu$m square preohmic 182. Although shapes other than square for preohmic contacts appear to be more desirable the overall result is to increase the size of the power transistor. A lateral PNP emitter 184 has a boundary 3.5 $\mu$m from the emitter preohmic 182; the shape of the emitter 184 is octagonal, the corners of a simple rectangular shape having been truncated to avoid preferred directions of current flow. A similarly shaped octagonal collector 186 is 6 $\mu$m wide and its inner edge at 6 $\mu$m from the emitter 184. A metal 187 of the aluminum copper (thickness 7K Å) from the trimetal process substantially surrounds a base area 188, apart from 1 $\mu$m, and contacts emitter 184 through contact 182.

Figure 19:
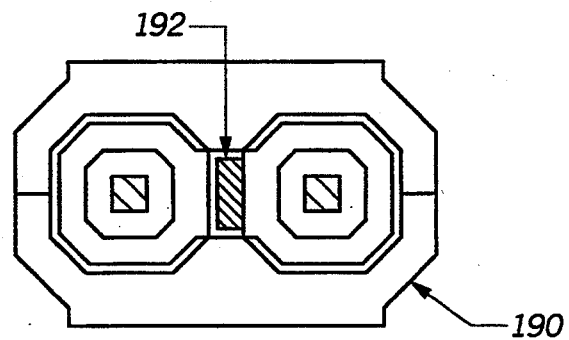

Referring to FIG. 19, the elementary transistor of FIG. 18 is then mirrored to obtain a twin elementary lateral PNP transistor 190. A $5 \times 10$ $\mu$m Via pattern 192 will allow to connect all the emitters by a 18K Å thick metal 2 bus 212 of FIG. 21.

Figure 20:
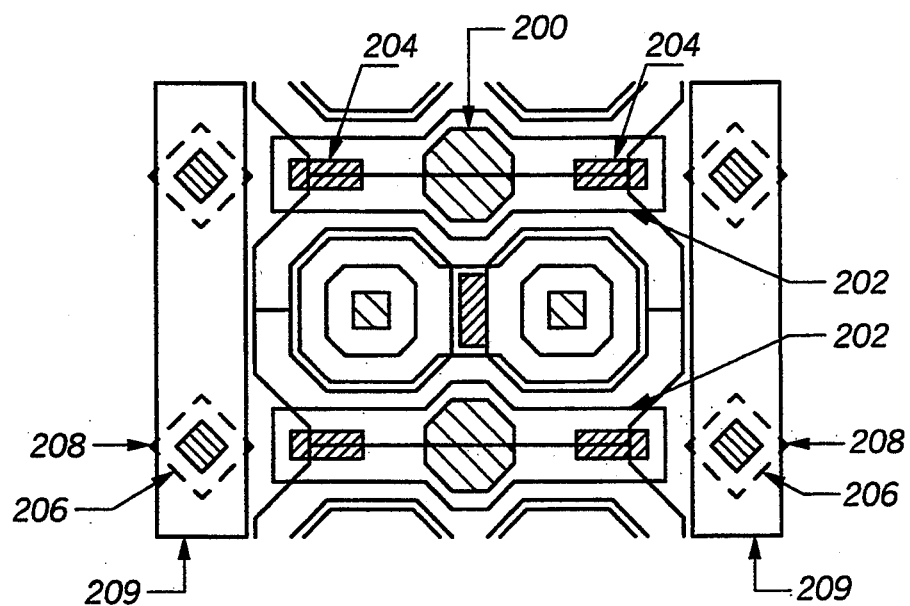

Referring to FIG. 20, which shows a column of adjacent twin elementary transistors 190 overlaid with metal 1 conduction lines, the octagonal shape of the twin elementary lateral PNP transistor 190 allows a big octagonal collector contact area 200 which is "close packed" between the transistors. The size of area 200 is only limited by the overlying Metal 1 layer 202 spacing rules (4 $\mu$m) and the Metal 1 overlap (2 $\mu$m) of the contact area 200 and of the $5 \times 10$ $\mu$m Via pattern 204; in addition, two collector contact areas 200 per twin elementary PNP transistor are used for lowering and distributing the collector series resistance.

Figure 21:
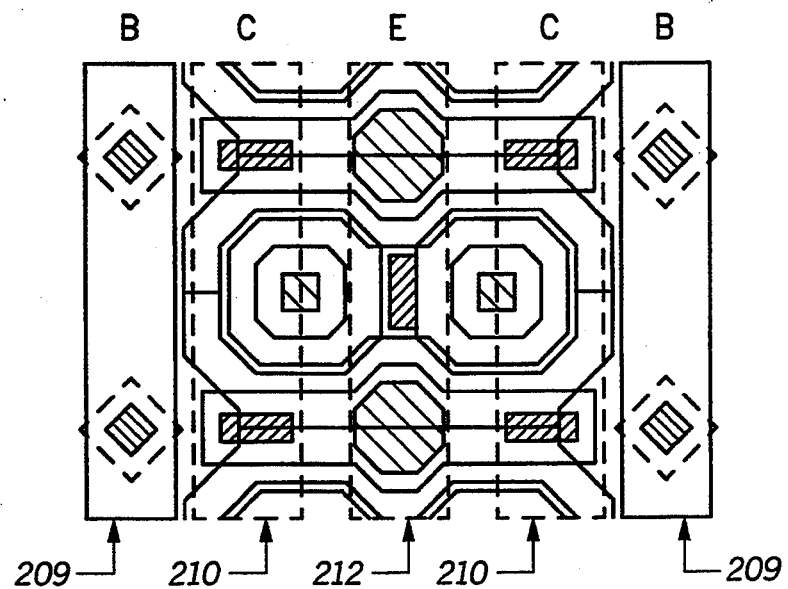

Two $5 \times 10$ $\mu$m Via patterns 204 per collector contact area are designed to connect all the collectors together by two 18KÅ thick metal 2 buses 210 (See FIG. 21). The power to the collector is conducted by buses 210.

For laying out the base contact of the twin elementary lateral PNP transistor 190, a $5 \times 5$ $\mu$m square preohmic 206 centered in a $9 \times 9$ $\mu$m (emitter n+) diffusion 208 is used; both are 45° rotated for saving silicon space. Four are employed per twin elementary PNP transistor for lowering and distributing the base series resistance. The (emitter n+) diffusions 208 are 7.5 $\mu$m from the collector of the twin elementary lateral PNP transistors and are connected together by each metal 1 lines 209 overlapping the $5 \times 5$ $\mu$m square preohmics 206 by 2 $\mu$m; this allows a base current of 7.1 mA maximum, the base current being 2.3 mA maximum per metal 1 line 209 for the device of FIG. 23. The base current is around 50 $\mu$A per elementary PNP transistor shown in FIG. 18.

As shown in FIG. 21, two 16 $\mu$m wide metal 2 lines 210 overlapping the via patterns 104 by 3 $\mu$m, are used to connect the collectors together and one 16 $\mu$m wide metal 2 line 212, is used to connect the emitters together, in conjunction with the via pattern 192. Each metal 2 line 210 or 212 allows a current of 54 mA maximum, the emitter current being 47.7 mA maximum per column; in other words, this power lateral PNP transistor is able to sink emitter current up to 600 mA. In no case, does the current density per via or preohmic exceed 50 $\mu$A/$\mu$m2. The spacing between the metal 2 lines 210 and 212 is 7 $\mu$m.

Figure 22:
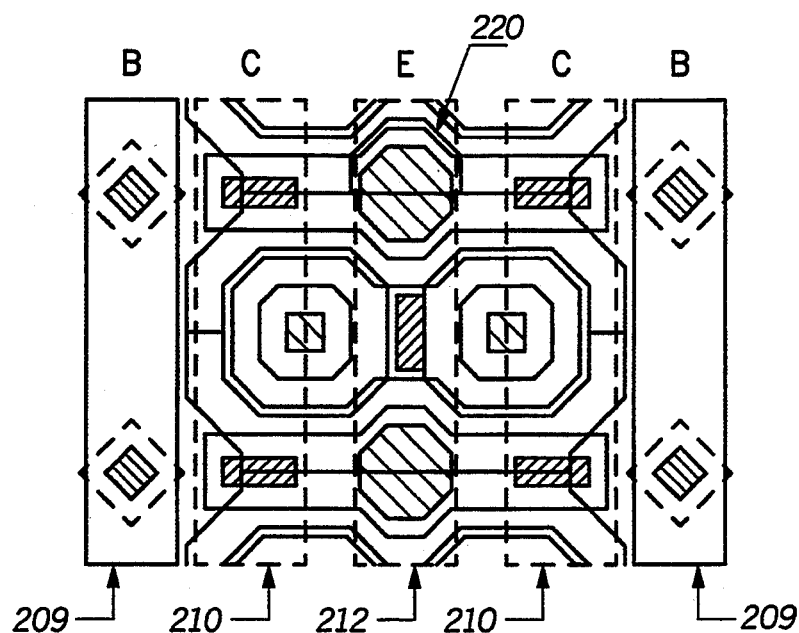

Referring to FIG. 22, the first and last rows of the twin elementary PNP transistor 190 are terminated by the pattern 220 to allow the completion of the full collector contact area 200.

Figure 23:
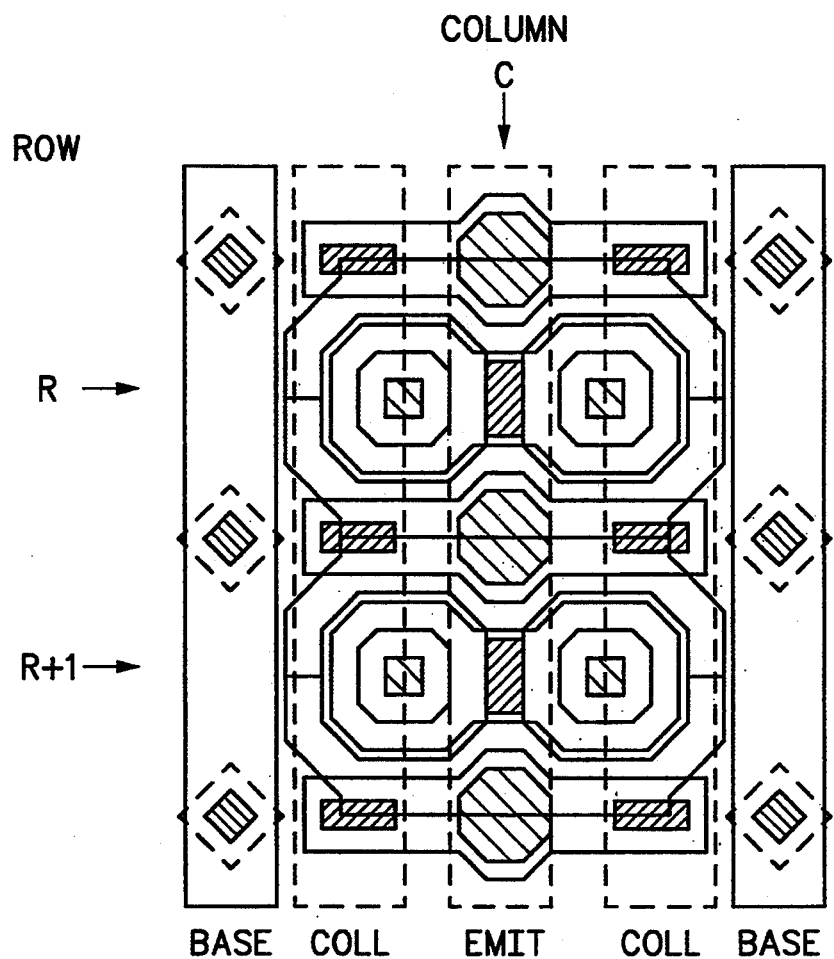

The smallest power lateral PNP transistor, achieving a low VCESAT ($<0.3$ V) at a collector current of 0.5 A and a forced current gain of 20, is obtained with 484 truncated elementary lateral PNP transistors arranged in eleven columns of twenty two rows of twin elementary lateral PNP transistors 190. Laid out as described its final size is around 1.3Kmil2. FIG. 23 represents a portion of this power lateral PNP transistor with one column C and two rows R and R+1 of twin elementary lateral PNP transistors 190.

The final electrical characterization results are:
VCESAT at IC=0.5 A and IB−25 mA<0.3 V (=176 mV)
VBESAT at VCE=0.3 V and IC=0.5 A (=838 mV)
HFE at IC=0.5 A and VCE=0.3 V (=24.5 V)
BVCBo at IC=10 $\mu$A>35 V (=376 V)
BVCEo at IC=100$\mu$>20 V (=23.2 V)

We claim:

1. A process for forming a lateral bipolar transistor, the process comprising the steps of:
   1) forming on a silicon substrate, in sequence, an epitaxial layer, a silicon oxide layer, a silicon nitride layer and a first masking layer;
   2) forming, in said silicon nitride layer, in a single operation through said first masking layer, at least one first aperture for forming a current electrode region, a second aperture for forming a base region, and at least one third aperture surrounding the first and second apertures for forming an isolation region which surrounds the current electrode region and the base region;
   3) removing said first masking layer;
   4) forming a second masking layer on said silicon nitride layer and producing a first oversize aperture in said second masking layer over said third aperture(s) in said silicon nitride layer;
   5) processing said epitaxial and silicon oxide layers through said first oversize aperture and third aperture(s) in said silicon nitride layer by selective etching, and doping, to provide isolation means in said isolation region;
   6) removing said second masking layer;
   7) forming a third masking layer on said silicon nitride layer and producing an oversize masking area only over said second aperture in said silicon nitride layer;
   8) implanting a high concentration of an impurity into said epitaxial layer through said first aperture(s) in said silicon nitride layer to produce a highly conductive doped area within said current electrode region;
   9) removing the oversize masking area; and
   10) implanting a base impurity through the second aperture in said silicon nitride layer to dope the base region.

2. The process of claim 1, wherein the step of forming said first, second and third apertures in said silicon nitride layer includes the step of removing portions of said silicon nitride layer by plasma etching.

3. The process of claim 1, wherein said step of processing said epitaxial and silicon oxide layers to provide isolation means in said isolation region includes the step of doping said epitaxial layer with boron to produce said isolation means.

4. The process of claim 3, wherein said step of doping said epitaxial layer with boron to produce said isolation means comprises heating the substrate with a coating of boron oxide thereon.

5. The process of claim 1, wherein said step of processing said epitaxial and silicon oxide layers to provide isolation means in said isolation region includes the step of etching the silicon dioxide layer to expose the substrate.

6. The process of claim 1, wherein the step of implanting a high concentration of an impurity into said epitaxial layer comprises implanting boron with a concentration of 5E15 $cm^{-2}$.

7. The process of claim 1, wherein said step of implanting a base impurity comprises implanting boron with a concentration of 6E14 $cm^{-2}$.

8. The process of claim 1, wherein two current electrode regions are formed, one constituting an emitter region and one constituting a collector region of the transistor.

9. The process of claim 8, wherein, in plan view, said emitter region is octagonally shaped and is surrounded by said base region which is of generally similar shape and which is in turn surrounded by said collector region which is of generally similar shape.

10. The process of clam 9, further comprising forming a contact positioned centrally of said octagonally shaped emitter region.

11. The process of claim 9 wherein a multiplicity of lateral bipolar transistor are formed, wherein said lateral bipolar transistors are arranged in columns, each element of a column comprising a pair of said lateral bipolar transistors positioned side by side.

12. The process of claim 11 wherein the emitters, collectors and bases of each of the multiplicity of lateral bipolar transistors are interconnected by a three metal layer metallisation, vias being provided between the metal layers of the metallisation for selective interconnection of the metal layers.

13. The process of claim 12 wherein a via is provided between the transistors of each of said pair of transistors for interconnection of emitter contacts, collector contacts being provided on the adjoining collector regions of each pair of transistors, and rectangular base contacts being provided on each side of a column of transistors wherein each base contact is positioned between the pairs of transistors, and oriented at $\pi/4$ relative to the column.

14. The process of claim 13 wherein the metallisation layers are arranged in strips extending down each column, base connector strips being positioned on each side of the column, an emitter connector strip being positioned centrally of the column, and collector connector strips being positioned between the base and emitter strips.

* * * * *